United States Patent [19]

Furuyama

[11] Patent Number: 5,294,776
[45] Date of Patent: Mar. 15, 1994

[54] METHOD OF BURNING IN A SEMICONDUCTOR DEVICE

[75] Inventor: Tohru Furuyama, Tokyo, Japan

[73] Assignee: Kabushiki Kaisha Toshiba, Kawasaki, Japan

[21] Appl. No.: 926,432

[22] Filed: Aug. 10, 1992

Related U.S. Application Data

[62] Division of Ser. No. 547,036, Jul. 2, 1990, Pat. No. 5,138,427.

[30] Foreign Application Priority Data

Jun. 30, 1989 [JP] Japan .................................. 1-169659

[51] Int. Cl.⁵ .................................. G01R 31/00
[52] U.S. Cl. .................................. 219/209; 324/73.1; 324/158 R
[58] Field of Search .................... 219/209, 210; 324/158 F, 73.1, 158 R

[56] References Cited

U.S. PATENT DOCUMENTS

| | | | |
|---|---|---|---|
| 3,781,683 | 12/1973 | Freed | 324/73 R |
| 3,849,872 | 11/1974 | Hubacher | 324/158 R |
| 4,038,648 | 7/1977 | Chesley | 324/73 P C |
| 4,281,449 | 8/1981 | Ports et al. | 324/158 R |
| 4,413,271 | 11/1983 | Gontowski, Jr. et al. | 324/158 R |
| 4,479,088 | 10/1984 | Stopper | 324/73 R |
| 4,812,742 | 3/1989 | Abel et al. | 324/73 R |
| 5,059,899 | 10/1991 | Farnworth et al. | 324/158 R |
| 5,070,296 | 12/1991 | Pricke | 324/73.1 |

FOREIGN PATENT DOCUMENTS

| | | |
|---|---|---|
| 59-11661 | 1/1984 | Japan. |
| 63-213965 | 9/1988 | Japan. |
| 1-298733 | 12/1989 | Japan. |
| 1250997 | 8/1986 | U.S.S.R. |

OTHER PUBLICATIONS

IBM Tech. Disclosure Bulletin, vol. 35, No. 6, Nov. 1992 "Chip Burn-In Accomplished at the Wafer Level".
IBM Tech. Disclosure Bulletin, vol. 25, No. 7B, Dec. 1982, "Self-Heating Test Chip for Reliability Life Test".
IBM Tech. Disclosure Bulletin, vol. 14, No. 6, Nov. 1971, "Self-Contained Chip Heater".

Primary Examiner—Bruce A. Reynolds
Assistant Examiner—John A. Jeffery
Attorney, Agent, or Firm—Banner, Birch, McKie & Beckett

[57] ABSTRACT

Since the power-supply and/or signal-transmission wiring layers connected to the semiconductor chip regions are formed, each individual integrated circuit can be burned in on the semiconductor wafer and, in other words, an integrated circuit can be burned in on a wafer level. The integrated circuit can thus be burned in at the end of a wafer process. An assembled semiconductor device is subjected to a high temperature or a high humidity, for checking the reliability of the assembled device.

40 Claims, 5 Drawing Sheets

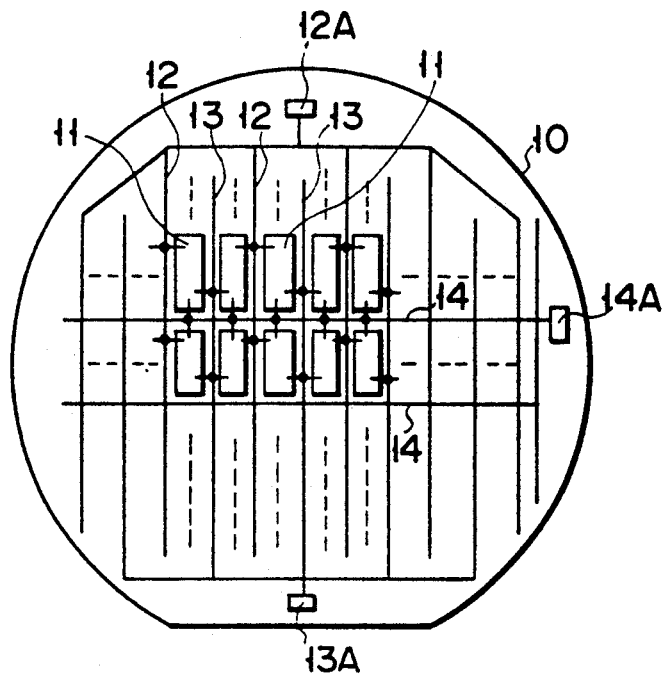
F I G. 1
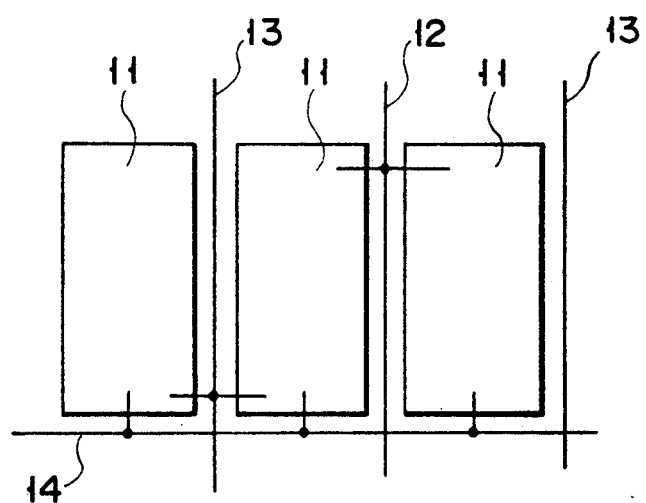
F I G. 3

METHOD OF BURNING IN A SEMICONDUCTOR DEVICE

This application is a division of application Ser. No. 07/547,036 filed Jul. 2, 1990, now U.S. Pat. No. 5,138,427.

BACKGROUND OF THE INVENTION

1. Field of the Invention

The present invention relates to a semiconductor device comprising a semiconductor wafer having a plurality of IC chip regions and a method of burning in the same.

2. Description of the Related Art

There are two purposes of burning in a semiconductor integrated circuit. The first purpose is to positively find a latent defect (e.g., a defect in an oxide film) caused in a wafer process so that only a perfect product can be selected in the subsequent screening process. In the first purpose, a semiconductor integrated circuit is burned in by applying a great electrical stress, i.e., by applying a high voltage, under a high ambient temperature. The second purpose is to positively find a latent defect (e.g., a crack in sealing resin) caused in an assembly process so that only a perfect product can be selected in the subsequent screening process. In the second purpose, a semiconductor integrated circuit is not necessarily burned in by applying an electrical stress and it is subjected to an environmental stress such as a high temperature or a high humidity, for checking the reliability of the assembled device.

Semiconductor integrated circuits have been conventionally burned in with each individual IC chip finished as a semiconductor device and, in other words, with each individual IC chip packaged. For this reason, a burn-in equipment is enlarged and complicated, and an investment for the burn-in equipment is increased and a cost of ensuring a place required for storing the burn-in equipment is heightened, which greatly increases the manufacturing costs of a semiconductor integrated circuit device. Since the burn-in operation is carried out with IC chips packaged, even a semiconductor integrated circuit such as a memory having a redundancy circuit suffers from the problem wherein latent defects cannot be eliminated and the yield of IC chips is difficult to be improved.

SUMMARY OF THE INVENTION

The present invention has been made in order to solve the above problem and its object is to provide a semiconductor device and a method of burning in the same wherein an integrated circuit can be burned in at the end of a wafer process.

According to an aspect of the present invention, there is provided a semiconductor device comprising a semiconductor wafer having a plurality of IC chip regions, and a plurality of power-supply and/or signal-transmission wiring layers connected to the IC chip regions and formed on the semiconductor wafer.

According to another aspect of the present invention, there is provided a method of burning in a semiconductor device comprising a plurality of IC chip regions and a semiconductor wafer including power-supply and/or signal-transmission wiring layers connected to the IC chip regions, wherein a power supply voltage and/or a signal is applied to the wiring layers.

Since the power-supply and/or signal-transmission wiring layers connected to the semiconductor chip regions are formed, each individual integrated circuit can be burned in on the semiconductor wafer and, in other words, an integrated circuit can be burned in on a wafer level. The integrated circuit can thus be burned in at the end of a wafer process. An assembled semiconductor device is subjected to a high temperature or a high humidity for checking the reliability of the assembled device.

A burn-in equipment can thus be simplified and miniaturized, and an investment for the burn-in equipment can be reduced and an area for installing it can be made small, which decreases the manufacturing costs of a semiconductor integrated circuit device. It is of course necessary to employ a new burn-in equipment capable of applying an electrical or thermal stress to the integrated circuit on the wafer. Such a new burn-in equipment is much simpler and smaller than a conventional burn-in equipment. Furthermore, manufacturing costs of the new burn-in device are low and an area for installing the device is small. If a burn-in operation is performed before dicing for separating the wafer into chips and then a screening test is carried out, a defective integrated circuit can be replaced with an auxiliary normal integrated circuit in a semiconductor integrated circuit device (e.g., memory) including a redundancy circuit and, in other words, a defective integrated circuit can be eliminated and thus the yield of IC chips is improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing the configuration of a semiconductor device according to an embodiment of the present invention;

FIG. 3 is a view specifically showing part of the configuration of the semiconductor device shown in FIG. 1 and used for explanation of connection between power supply wiring layers and IC chip regions;

DETAILED DESCRIPTION OF THE PREFERRED EMBODIMENTS

Figure 2A:
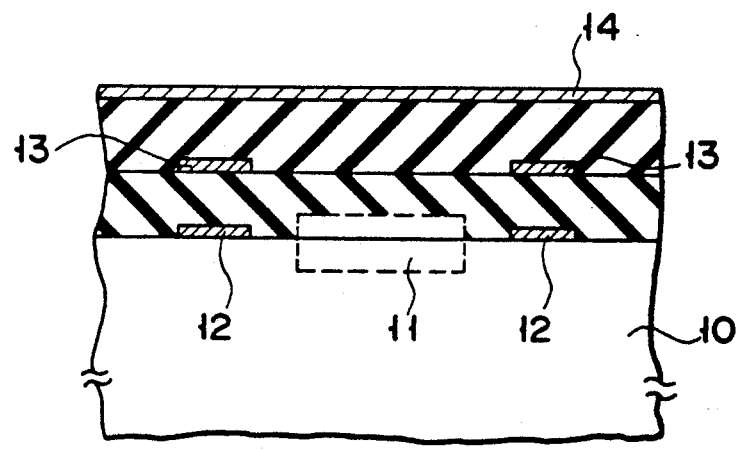
FIGS. 2A and 2B are cross-sectional views of a semiconductor device.

Embodiments of the present invention will be described in detail when taken in conjunction with the accompanying drawings.

FIG. 1 is a schematic view showing a semiconductor device according to the first embodiment of the present invention. In FIG. 1, semiconductor wafer 10 has a plurality of IC chip (e.g., dynamic RAM chip) regions 11. A plurality of power supply wiring layers 12 and 13 is formed on semiconductor wafer 10 and connected to a power supply for driving circuits in IC chip regions 11. Wiring layers 12 and 13 are formed on dicing line regions between chip regions 11 in the longitudinal direction of FIG. 1.

Wiring layers 12 and 13 are alternately arranged on the dicing line regions of the semiconductor wafer in the longitudinal direction of FIG. 1. Adjacent two wiring layers 12 and 13 are connected to a power supply terminal (not shown) of chip region 11 interposed between the wiring layers (FIG. 3). Signal (e.g., clock signal) transmission wiring layer 14, which is supplied with a signal for controlling the operation of a circuit of chip region 11, is formed on a dicing line region in a direction perpendicular to wiring layers 12 and 13, in other words, in a lateral direction of FIG. 1. Wiring layer 14 is connected to a signal terminal (not shown) of chip region 11 which is adjacent to wiring layer 14.

Wiring layers 12, 13 and 14 are made of, e.g., aluminum and can be formed by the same patterning as that for a wiring layer formed in each of chip regions 11.

Figure 8A:
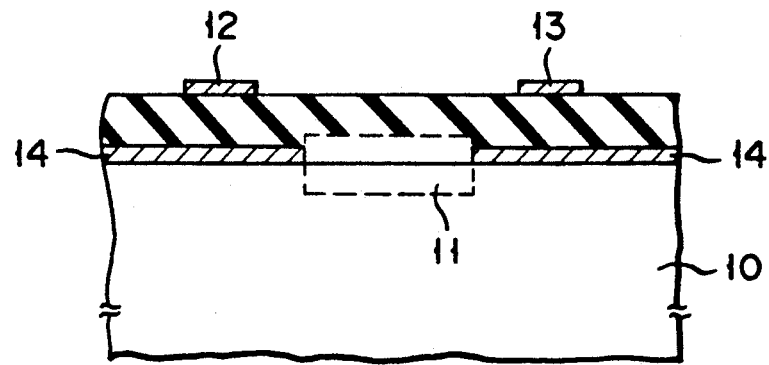
FIGS. 8A and 8B are cross-sectional views of the semiconductor device shown in FIG. 1.

A circuit (not shown) for generating a signal for controlling a chip operation during the burn-in process is formed on chip regions or on dicing line regions and is supplied with a power supply voltage from wiring layer 12 or 13. Contact terminals 12A and 13A are formed on the wafer. Contact terminal 12A is connected in common to plural wiring layers 12 and contact terminal 13A is connected in common to plural wiring layers 13. Contact terminals 12A and 13A receive power supply voltages $V_1$ and $V_2$ from the outside of the wafer and apply these voltages to wiring layers 12 and 13. Contact terminal 14A is formed on the wafer and connected to plural wiring layers 14. Contact terminal 14A receives a signal from the outside of wafer and supplies it to wiring layer 14. As illustrated in FIG. 1, contact terminals 12A and 13A are formed at both ends of the wafer. FIG. 8A shows an example of a cross-sectional view of the semiconductor device shown in FIG. 1. In FIG. 8A, the wiring layer 14 is formed on the semiconductor wafer 10, an insulation film is on the structure, and the wiring layers 12 and 13 are formed on the insulation film and separated from each other. Wiring layers 12 and 13 cross wiring layer 14, with the insulation film provided therebetween.

Figure 8B:
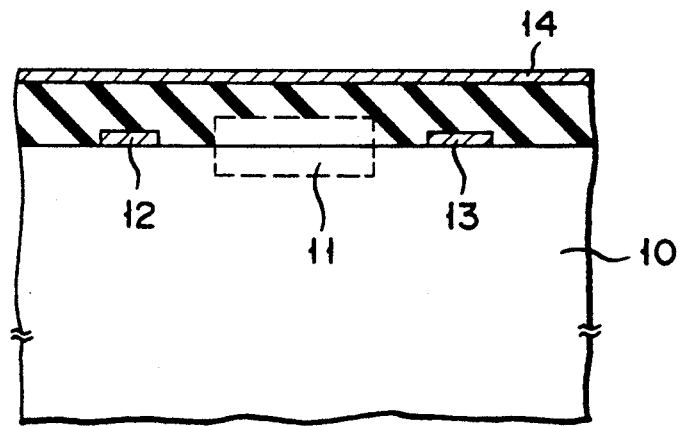

FIG. 8B shows another example of a cross-sectional view of the semiconductor device shown in FIG. 1. In FIG. 8B, wiring layers 12 and 13 are formed on the semiconductor wafer 10 and separated from each other. An insulation film (not shown) is formed on the structure, and the wiring layer 14 is formed on the insulation film. Wiring layers 12 and 13 cross wiring layer 14, with the insulation film provided therebetween.

Figure 2B:
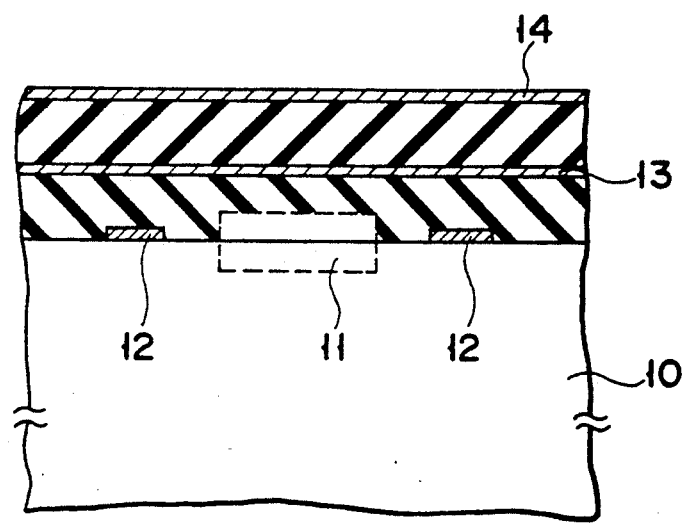

When an insulation film is interposed between wiring layers 12 and 13, these wiring layers can be arranged in parallel to each other as shown in FIG. 2A, and they can cross each other as shown in FIG. 2B. Wiring layer 14 is formed on another insulation film which is formed on wiring layer 13 (FIGS. 2A and 2B). Otherwise, wiring layer 14 can be formed on the lowermost layer of the wafer or on a layer between layers 12 and 13. In this multi-layered structure, a first, second and third wiring layers can be made of polysilicon, silicide and metal, respectively. All the wiring layers can be made of metal. The metal is proferably aluminum; however other kind of metal can be used.

Each of chip regions 11 formed on wafer 10 shown in FIG. 1 is finally divided into chips after the burn-in process, and the chips are then assembled and finished as integrated circuits. Chip regions (e.g., chip regions for test elements required at the stage of development) to which neither power supply wiring layers nor signal transmission wiring layers are connected, can be formed on wafer 10. When different integrated circuits are formed between chip regions, a common wiring layer is connected to a chip regions for the same integrated circuit.

In burning in integrated circuits 11 on wafer 10, wafer 10 is attached to a socket (not shown), and predetermined power supply voltage $V_1$ and ground voltage $V_2$ are externally applied to integrated circuits 11 through contact pads 12A and 13A. If ordinary power supply voltage Vcc is used as $V_1$ and ground voltage Vss is used as $V_2$, a static burn-in operation can be performed and, in this case, no probe cards are needed. When the need arises, a power supply voltage can be directly applied to the semiconductor wafer.

According to the first embodiment of the present invention, since the power supply wiring layer and the signal transmission wiring layer, which are connected to the chip regions, are formed., each individual integrated circuit can be burned in on the semiconductor wafer and, in other words, the burn-in of each integrated circuit can be performed on a wafer level. The integrated circuit can thus be burned in at the end of the wafer process. If the integrated circuits are assembled into a semiconductor device, it is subjected to a high temperature and a high humidity, for checking the reliability of the assembled device.

Consequently, a burn-in equipment can be simplified and miniaturized, and an investment for the burn-in equipment can be reduced and an area for installing it can be made small, which decreases the manufacturing costs of a semiconductor integrated circuit device It is of course necessary to employ a new burn-in equipment capable of applying an electrical or thermal stress to the integrated circuit on the wafer. Such a new burn-in equipment is much simpler and smaller than a conventional burn-in equipment. Furthermore, manufacturing costs of the new burn-in equipment are low and an area for installing the device is small. If a burn-in operation is performed before dicing for separating the wafer into chips and then a screening test is carried out, a defective integrated circuit can be replaced with an auxiliary normal integrated circuit in a semiconductor integrated circuit device (e.g., memory) including a redundancy circuit and, in other words, a defective integrated circuit can be saved and thus the yield of IC chips is improved.

After the integrated circuit on the wafer is burned in, the wafer is diced and finally separated into a plurality of chips. The power supply and signal transmission wiring layers are thus cut on the dicing line regions. In a multi-layered structure, a short circuit may occur between the wiring layers into which an inter layer insulation film and the wiring layers (not shown) in the chips. In order to avoid the short circuit, it is desirable to separate the power supply and signal transmission wiring layers from the wiring layers in the chips before the dicing. One of specific methods of separating these layers is to cut the connection regions of the power supply and signal transmission wiring layers and the wiring layers in the chips. If these wiring layers are made of aluminum, the connection regions can be cut by irradiating a laser beam or a convergent ion beam. Another method is to use an element for electrically separating these wiring layers. As the simplest method of separating the wiring layers, if the power supply and signal transmission wiring layers are not necessarily required after the respective chips are finished as integrated circuit devices, these wiring layers are removed before the dicing.

Figure 4:
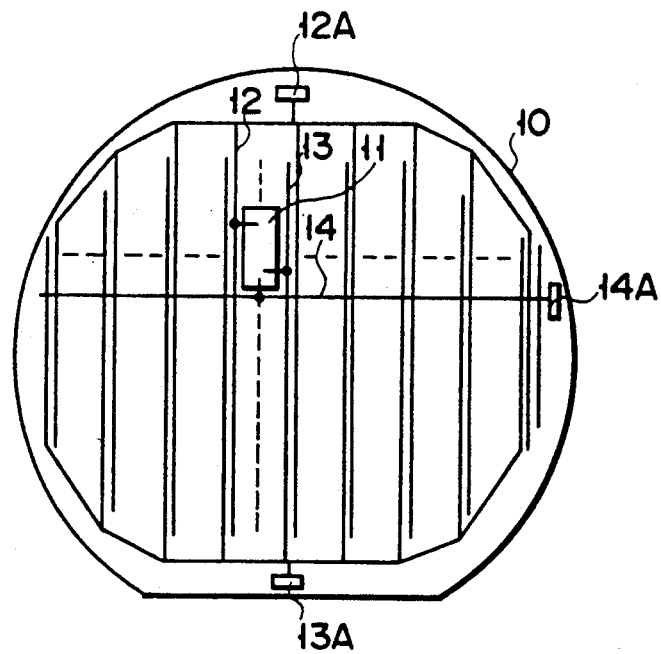
FIG. 4 is a schematic view showing the configuration of a semiconductor device according to another embodiment of the present invention.

FIG. 4 is a schematic view showing a semiconductor device according to the second embodiment of the present invention. Since the second embodiment is the same as the first embodiment except in that power supply wiring layers 12 and 13 are formed on each of dicing line regions in the longitudinal direction of a wafer in FIG. 4, the same reference numerals as those in FIG. 1 are added to FIG. 4. In FIG. 4, only one of a plurality of IC chip regions is shown for simplification of the drawing.

In the second embodiment, an integrated circuit can be burned in on the wafer and thus the same effect as that of the first embodiment can be obtained.

Figure 5:
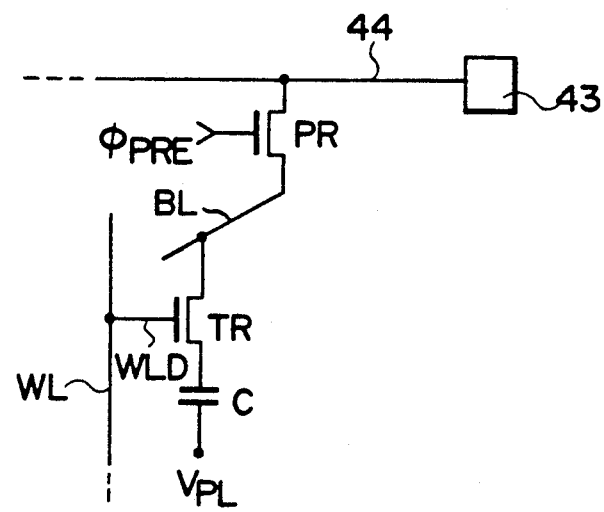
FIG. 5 is a circuit diagram specifically showing part of an IC chip region of the semiconductor device shown in FIG. 1 or 4 and used for explanation of connection between an integrated circuit and power supply wiring layers.
Figure 5:
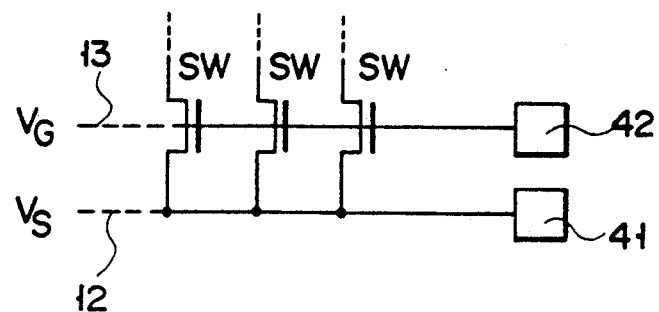

An example of the burn-in process will be described with reference to FIG. 5. FIG. 5 illustrates a circuit (including dynamic type memory cell, word line, bit line) on an IC chip region such as a dynamic RAM chip region. Two power supply wiring layers 12 and 13 are connected to the circuit. In FIG. 5, reference numerals 41, 42 and 43 denote contact terminals on the dynamic RAM chip region; C, a cell capacitor; TR, a transfer gate MOS transistor; WL, a word line; BL, a bit line; and SW, switching MOS transistors inserted in series between word lines WL and power supply wiring layer 12. Power supply wiring layer 13 is connected to the gates of transistors SW. PR indicates a precharging MOS transistor inserted in series between bit line BL and bit line precharging power supply line 44. Precharging signal line $\phi$PRE is connected to the gate of the precharging MOS transistor.

In the normal operation of the dynamic RAM, word line drive potential WLD which is higher than ordinary power supply voltage Vcc, is applied to a selective word line WL. The highest reliability is therefore required for the transfer gate MOS transistor whose gate is connected to word line WL. It is necessary to drive a plurality of word lines in sequence to burn in transfer gate MOS transistors TR connected to the word lines. The number of word lines selected in one burn-in operation cycle is very small and usually each of the word lines is selected every 1000 cycles only. The efficiency of the burn-in operation is very low. It takes a very long time to burn in only one integrated circuit and the burn-in efficiency becomes much lower.

According to the present invention, the burn-in time can be shortened by the use of a burn-in method wherein a stress is directly applied. The burn-in method of the present invention will be described with reference to the circuit shown in FIG. 5. Bit line precharge power supply line 44 set at ground potential Vss and precharge signal line $\phi$PRE is activated to turn on precharge MOS transistor PR. Power supply voltage $V_S$ which is substantially the same as word line drive potential WLD, is applied to power supply wiring layer 12, and power supply voltage $V_G$ which is higher than power supply voltage $V_S$ by more than the threshold voltage of transfer gate MOS transistor TR, is applied to power supply wiring layer 13. A direct voltage stress can thus be applied between power supply wiring layer 12 and the bit line BL. If MOS transistor TR is latently defective, it becomes perfectly defective by the direct voltage stress. If no voltage is applied to bit line precharge power supply line 44 or precharge signal line $\phi$PRE and power supply voltages $V_S$ and $V_G$ are applied to power supply wiring layers 12 and 13, respectively, a direct stress can be applied between power supply wiring layer 12 and the semiconductor substrate. Similarly, if MOS transistor TR is latently defective, it becomes perfectly defective by the direct stress.

When two power supply wiring layers and two signal wiring layers are arranged, if power supply voltage Vcc, ground potential Vss, row address strobe signal $\overline{RAS}$, and column address strobe signal $\overline{CAS}$ are supplied to these wiring layers, the burn-in operation can be carried out in $\overline{CAS}$ before $\overline{RAS}$ refresh mode.

In the first and second embodiments, since power supply wiring layers 12 and 13 and signal transmission wiring layer 14 are formed by the same patterning as that of the wiring layers formed in the chip regions, a manufacturing process can be simplified. These wiring layers are made of aluminum in the above embodiments; however, they can be made of polysilicon or silicide.

In the first and second embodiments, the power supply and the signal transmission wiring layers and wiring layers used in the chip regions are formed by patterning the same wiring layer. However, the power supply and signal transmission wiring layers can be formed by patterning different wiring layers, and can be connected to wiring layers used in the chip regions through a contact hole or a bonding wire and, in this case, a wiring scheme can be achieved regardless of an element pattern of each of the chip regions. The power supply wiring layers can have a single-layered structure wherein they formed on the same insulation film or a multi-layered structure wherein they are separated by an interlayered insulation film. Further, it is possible to form a multi-layered structure consisting of the power supply and signal transmission wiring layers and the wiring layers used in the chip regions. It is also possible to form a wiring layer for exclusively performing a burn-in operation in an operation mode which cannot be executed in a packaged state or performing a burn-in operation so as to apply a stress to a part of the integrated circuit.

Even when the wiring layer for exclusively performing the burn-in operation is formed, a short circuit may occur between the power supply and signal transmission wiring layers and the wiring layers in the chip regions, or between these wiring layers and the semiconductor substrate, when the integrated circuits on the wafer are separated. To prevent the short circuit, it is desirable that the power supply and signal transmission wiring layers are separated from the wiring layers in the chip regions before the dicing. The method of separating these wiring layers has been already described above.

When a voltage is applied to a number of integrated circuits in the burn-in process and then a short circuit occurs between the Vcc and Vss power supplies in a chip, this short circuit affects a voltage which is applied to another integrated circuit for a burn-in operation. To eliminate this influence, it is desirable that a resistor having a proper value is arranged between the power supply and signal transmission wiring layers and the wiring layers formed in the chip regions. The resistance of the resistor is set to be higher, preferably much higher than a sheet resistance of each of the wiring layers.

Figure 6:
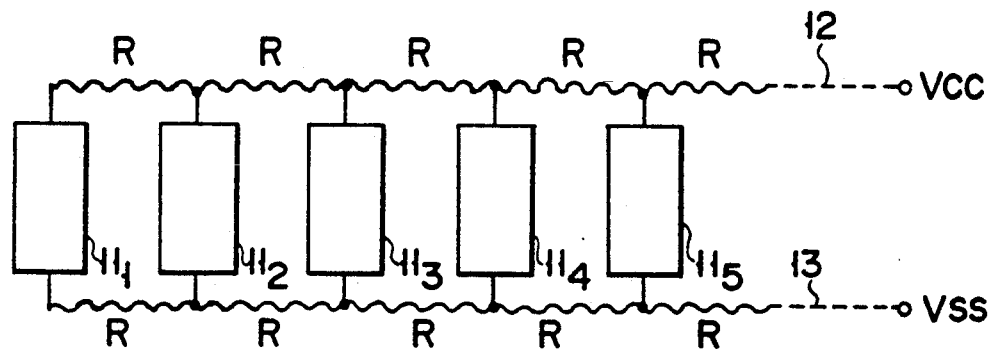
FIG. 6 is a circuit diagram showing a number of integrated circuits to which a voltage stress is applied to burn in the semiconductor device of the present invention.

The resistance of the resistor will be described in detail with reference to FIGS. 6 and 7. FIG. 6 illustrates a circuit in which power supply wiring layers 12 and 13 are connected to Vcc and Vss power supplies, respectively to apply a voltage stress to a number of chips $11_1$, $11_2, \ldots, 11_n$. In FIG. 6, R represents resistors of wiring layers 12 and 13.

Assuming that there is a short circuit between the Vcc power supply and the Vss power supply in integrated circuit $11_3$, a great number of currents flow into integrated circuit $13_3$ and a voltage drops by resistance R of each of power supply wiring layers 12 and 13. Therefore, a voltage of a predetermined level for a burn-in operation is applied to neither integrated circuits $11_1$ and $11_2$ located farther than integrated circuit $11_3$ from power supplies Vcc and Vss nor integrated circuit $11_4$ located close to integrated circuit $11_3$ but nearer to the power supplies than integrated circuit $11_3$.

Figure 7:
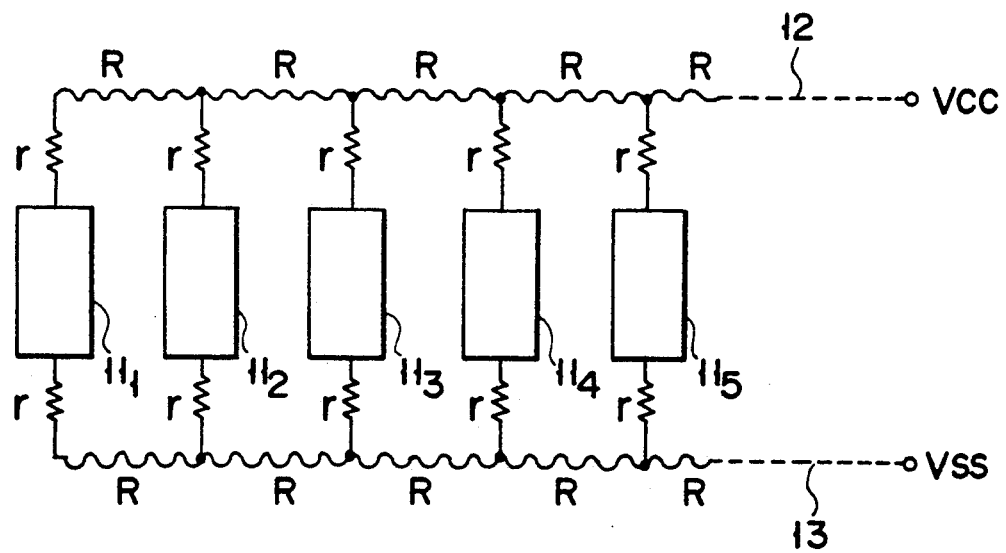
FIG. 7 is a circuit diagram showing a number of integrated circuits to which a voltage stress is applied to burn in the semiconductor device of the present invention.

To avoid the above, as illustrated in FIG. 7, a resistor r is interposed between each of power supply wiring layers 12 and 13 and wiring layer used in each of the chip regions. Even if there is a short circuit between power supplies Vcc and Vss in integrated circuit $11_3$, the currents flowing into integrated circuit $11_3$ are restricted by resistor r. If the resistance of resistor r is much larger than resistance R of the power supply wiring layers, the voltage drop of the power supply wiring layers due to the currents flowing into integrated circuit $11_3$ is not so great and can be neglected. A voltage having a predetermined level for a burn-in operation is thus applied to integrated circuits $11_1$ and $11_2$ located farther than integrated circuit $11_3$ from the power supplies and integrated circuit $11_4$ located close to integrated circuit $11_3$.

In the above embodiments, since the power supply and signal transmission wiring layers are formed as wiring layers connected to a plurality of semiconductor chip regions, the integrated circuits can be easily burned in on the wafer level. Even when only one of the wiring layers is formed, the integrated circuits can be burned in on the wafer level.

As described above, according to the semiconductor memory device of the present invention, an integrated circuit can be burned in on a wafer at the end of the wafer process. A burn-in equipment can be simplified and miniaturized, and an investment for the burn-in equipment can be reduced and an area for installing it can be made small, which decreases the manufacturing costs of a finally-finished semiconductor integrated circuit device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for burning in a semiconductor wafer during a test mode, said semiconductor wafer including chip regions and first wirings connected to said chip regions, each chip region including a circuit, a first circuit line, and a first switch responsive to a first switch voltage for electrically connecting the first circuit line and at least a first one of said first wirings during the test mode, the method comprising the steps of:

applying a stress voltage to the first one of said first wirings from a voltage source external to said semiconductor wafer; and applying the first switch voltage to at least a second one of said first wirings from a voltage source external to said semiconductor wafer in order to electrically connect the first one of said first wirings to the first circuit lines of said circuits and thereby stress said circuits.

2. The method according to claim 1, wherein each chip region further includes second circuit lines and a second switch response to a second switch voltage for electrically connecting the second circuit line and at least a third one of said first wirings during the test mode, and the method further comprises the step of:

applying the second switch voltage to at least a fourth one of said wirings from a voltage source external to said semiconductor wafer in order to electrically connect the third one of said first wirings to the second circuit lines of said circuits to further stress said circuits.

3. The method according to claim 1, wherein said semiconductor wafer further includes a plurality of contact terminals for applying a supply voltage and a signal from a signal source external to said semiconductor wafer.

4. The method according to claim 1, further comprising the steps of:

disconnecting said chip regions from each other; and
forming said chip regions into integrated circuits.

5. The method according to claim 1, wherein said first wirings are formed from a wiring layer from which second wirings used in said chip regions are formed.

6. The method according to claim 5, wherein said first wirings are formed on dicing line regions on said semiconductor wafer.

7. The method according to claim 5, wherein said semiconductor wafer further includes a resistor element interposed between said first and second wirings.

8. The method according to claim 7, wherein said resistor element has a resistance higher than a sheet resistance of said first and second wirings.

9. The method according to claim 5, wherein said first wirings are disconnected from said second wirings prior to dicing.

10. The method according to claim 1, wherein said first wirings are formed from a wiring layer different than that from which second wirings used in said chip regions are formed.

11. The method according to claim 10, wherein said first wirings are formed on dicing line regions on said semiconductor wafer.

12. The method according to claim 11, wherein said first wirings are removed before dicing.

13. The method according to claim 10, wherein said semiconductor wafer further includes a resistor element interposed between said first and second wirings.

14. The method according to claim 13, wherein said resistor element has a resistance higher than a sheet resistance of said first and second wirings.

15. The method according to claim 1, wherein each circuit of said chip regions includes a redundancy circuit, the voltage stress test is conducted at the end of the wafer process, and each circuit which is detected to be defective as a result of the voltage stress test is replaced with its corresponding redundancy circuit.

16. The method according to claim 1, wherein said chip regions are arranged in rows and columns and the step of applying the first switch voltage comprises applying the first switch voltage to at least a second one of said first wirings from a voltage source external to said semiconductor wafer in order to electrically connect the first one of said wirings to the first circuit lines of at least two circuits in one row and at least two circuits in one column and thereby stress said circuits.

17. A method for subjecting a plurality of IC chip regions formed on a semiconductor wafer to a voltage stress test, each of said chip regions including a dynamic type memory circuit operated in a CAS-before-RAS-refresh mode, said semiconductor wafer including two power supply wirings for application of a power supply voltage and a ground potential and two signal wirings for supply of a row address strobe (RAS) signal and a column address strobe (CAS) signal, said two power supply wirings and said two signal wirings being connected in common to each of said dynamic type memory circuits of said chip regions, the method comprising the steps of:

at the time of the voltage stress test, applying a power supply voltage and a ground potential to said two power supply wirings from the outside of said semiconductor wafer, and supplying a CAS signal and a RAS signal in the described order to said two signal wirings.

18. The method according to claim 17, wherein said semiconductor wafer further includes a plurality of contact terminals for applying a supply voltage and a signal a signal source external to said semiconductor wafer.

19. The method according to claim 17, further comprising the steps of:

disconnecting said chip regions from each other; and forming said chip regions into integrated circuits.

20. The method according to claim 17, wherein said two power supply wirings and said two signal wirings are formed from a wiring layer from which first wirings used in said chip regions are formed.

21. The method according to claim 20, wherein said two power supply wirings and said two signal wirings are formed on dicing line regions on said semiconductor wafer.

22. The method according to claim 21, wherein said two power supply wirings and said two signal wirings are disconnected from said first wirings prior to dicing.

23. The method according to claim 22, wherein said semiconductor wafer further includes a resistor element interposed between said first wirings.

24. The method according to claim 23, wherein said resistor element has a resistance higher than a sheet resistance of said first wirings.

25. The method according to claim 17, wherein said two power supply wirings and said two signal wiring are formed from a wiring layer different from that from which first wirings used in said chip regions are formed.

26. The method according to claim 25, wherein said two power supply wirings and said two signal wirings are formed on dicing line regions on said semiconductor wafer.

27. The method according to claim 26, wherein said two power supply wirings and said two signal wirings are removed before dicing.

28. The method according to claim 25, wherein said semiconductor wafer further includes a resistor element interposed between said first wirings.

29. The method according to claim 28, wherein said resistor element has a resistance higher than a sheet resistance of said first wiring.

30. The method according to claim 17, wherein each of dynamic type memory circuits of said chip regions includes a redundancy circuit, the voltage stress test is conducted at the end of the wafer process, and a dynamic type memory circuit which is detected to be defective as a result of the voltage stress test is replaced with its corresponding redundancy circuit.

31. A method of burning in a semiconductor device, comprising the steps of:

(a) forming chip regions on a semiconductor wafer, including the steps of forming a circuit in each chip region, forming first circuit lines connected to each circuit, and forming first switches having first terminals connected to a respective one of said first circuit lines an control terminals responsive to a first switch voltage for controlling switching of said first switch;

(b) forming first wirings on said semiconductor wafer, including the steps of connecting first ones of said first wirings to second terminals of said first switches and connecting second ones of said first wirings to said control terminals of said first switches;

(c) stressing said circuits of said chip regions by applying a stress voltage thereto, including the steps of applying the stress voltage to said first ones of said first wirings from a first voltage source external to said semiconductor wafer, and applying the first switch voltage to said second ones of said first wirings from a second voltage source external to said semiconductor wafer in order to switch said first switches and electrically connect said first ones of said first wirings to the first lines of said circuits, thereby applying the stress voltage to said circuits via said first circuit lines.

32. The method according to claim 31, wherein said circuits comprise memory circuits and said first circuit lines comprise word lines.

33. The method according to claim 31, wherein the step of forming said chip regions further includes a step of forming second circuit lines coupled to each circuit and a step of forming second switches having first terminals connected to a respective one of said second circuit lines and control terminals responsive to a second switch voltage for controlling switching of said second switch;

the step of forming said first wirings further includes a step of connecting third ones of said first wirings to second terminals of said second switches and connecting fourth ones of said first wirings to said control terminals of said second switches; and the step of stressing said circuits further includes a step of applying the stress voltage to said third ones of said first wirings and a step of applying the second switch voltage to said fourth ones of said first wirings from a third voltage source external to said semiconductor wafer in order to switch said second switches and electrically connect said third ones of said first wirings to said second circuit lines of said circuits, thereby applying the stress voltage to said circuits via said first circuit lines.

34. The method according to claim 33, wherein said circuits comprise memory circuits, said first circuit lines are word lines, and said second circuit lines are bit lines.

35. The method according to claim 31, wherein the step of forming said first wirings comprises forming said first wirings on a dicing region portion of said semiconductor wafer.

36. The method according to claim 35, wherein the step of forming said first wirings comprises patterning a wiring layer.

37. The method according to claim 36, further comprising the step of patterning a wiring layer further comprises forming second wirings in said chip regions.

38. The method according to claim 37, further comprising the step of forming resistors between said first and second wirings.

39. A method of burning in a semiconductor device, comprising the steps of:
 (a) forming chip regions on a semiconductor wafer, including the steps of forming a memory circuit in each chip region, forming word lines connected to each circuit, and forming first switches having first terminals connected to a respective one of said word lines and control terminals responsive to a first switch voltage for controlling switching of said first switches;
 (b) forming first wirings on said semiconductor wafer, including the steps of connecting first ones of said first wirings to second terminals of said first switches and connecting second ones of said first wirings to said control terminals of said first switches; and
 (c) stressing said memory circuits of said chip regions by applying a stress voltage thereto, including the steps of applying the stress voltage to said first ones of said first wirings from a first voltage source external to said semiconductor wafer, and applying the first switch voltage to second ones of said first wirings from a second voltage source external to said semiconductor wafer in order to switch said first switches and electrically connect said first ones of said first wirings to said word lines of said memory circuits, thereby applying the stress voltage to said memory circuits via said word lines.

40. A method of burning in a semiconductor device, comprising the steps of:
 (a) forming chip regions on a semiconductor wafer, including the steps of forming a memory circuit in each chip region, forming word lines connected to each circuit, forming bit lines connected to each circuit, forming first switches having first terminals connected to a respective one of said word lines and control terminals responsive to a first switch voltage for controlling switching of said first switches, and forming second switches having first terminals connected to a respective one of said bit lines and control terminals responsive to a second switch voltage for controlling switching of said second switches;
 (b) forming first wirings on said semiconductor wafer, including the steps of connecting first ones of said first wirings to second terminals of said first switches, connecting second ones of said first wirings to said control terminals of said first switches, and connecting third ones of said first wirings to second terminals of said second switches, and connecting fourth ones of said first wirings to said control terminals of said second switches; and
 (c) stressing said memory circuits of said chip regions by applying a stress voltage thereto, including the steps of applying the stress voltage to said first ones of said first wirings from a first voltage source external to said semiconductor wafer, applying the first switch voltage to second ones of said first wirings from a second voltage source external to said semiconductor wafer in order to switch said first switches and electrically connect said first ones of said first wirings to said word lines of said memory circuits, applying the stress voltage to said third ones of said first wirings from a third voltage source external to said semiconductor wafer, applying the second switch voltage to said fourth ones of said first wirings from a fourth voltage source external to said semiconductor wafer in order to switch said second switches and electrically connect said third ones of said first wirings to said bit lines of said memory circuits, thereby applying the stress voltage to said memory circuits via said word lines and said bit lines.

* * * * *